(12) United States Patent
Ashton et al.

(10) Patent No.: US 6,534,834 B1
(45) Date of Patent: Mar. 18, 2003

(54) POLYSILICON BOUNDED SNAPBACK DEVICE

(75) Inventors: Robert A. Ashton, Orlando, FL (US); Yehuda Smooha, Allentown, PA (US)

(73) Assignee: Agere Systems, Inc., Allentown, PA (US)

(*) Notice: Subject to any disclaimer, the term of this patent is extended or adjusted under 35 U.S.C. 154(b) by 0 days.

(21) Appl. No.: 10/024,803

(22) Filed: Dec. 19, 2001

(51) Int. Cl.[7] .............................................. H01L 23/62
(52) U.S. Cl. ...................... 257/355; 257/360; 257/361; 257/362; 257/213; 257/546; 257/497
(58) Field of Search .................. 257/360, 361, 257/362

(56) References Cited

U.S. PATENT DOCUMENTS

| | | | |
|---|---|---|---|
| 5,646,062 A | * 7/1997 | Yuan et al. | 438/281 |
| 6,046,087 A | * 4/2000 | Lin et al. | 438/279 |
| 6,365,937 B1 | * 4/2002 | Porter et al. | 257/355 |
| 6,376,880 B1 | * 4/2002 | Holst | 257/347 |

* cited by examiner

*Primary Examiner*—Nathan J. Flynn
*Assistant Examiner*—Pershelle Greene
(74) *Attorney, Agent, or Firm*—Christie, Parker & Hale, LLP (57) ABSTRACT

A snapback device functions as a semiconductor protection circuit to prevent damage to integrated circuits due to events such as electrostatic discharge and the like. The snapback device is capable of carrying considerable current at a reduced voltage once it snaps back into bipolar operation mode after its trigger point is achieved. The snapback device includes the advantage of a low breakdown voltage which enables the snapback device to snap back into bipolar mode before damage is done to active circuit components due to their breakdown voltages being exceeded. The snapback device includes $n^+$ active areas formed within a p-well substrate region and each active area includes a polysilicon film overlapping the active area but insulated therefrom by a dielectric film. Each $n^+$ active area and polysilicon film are coupled by a conductive film and the components combine to form one electric node. One electric node of the snapback device is coupled to I/O terminals of the device and the other is coupled to ground or a power supply.

21 Claims, 5 Drawing Sheets

POLYSILICON BOUNDED SNAPBACK DEVICE

FIELD OF THE INVENTION

The present invention is generally related to semiconductor integrated circuits. More particularly, the present invention is related to a circuit element used in protection circuits of semiconductor integrated circuits and the like.

BACKGROUND OF THE INVENTION

Integrated circuits and other semiconductor devices are susceptible to being damaged or completely destroyed by various electrostatic discharge (ESD) events and the like. Protection circuits are therefore advantageously included on chips to prevent and reduce damage from such events. More particularly, the protection circuits are formed and situated to absorb the electrostatic discharge and preclude the ESD event from damaging the functional or active circuit elements of the integrated circuit or other semiconductor device. The protection circuit elements are preferably adapted to carry considerable current during an ESD event, current which would otherwise damage or destroy the integrated circuit or other semiconductor device within which the protection circuit element is incorporated.

One of the protection circuit elements used for ESD protection is a parasitic n-p-n bipolar transistor, sometimes called a "snapback" device. Snapback devices are easily manufacturable, have low leakage characteristics, and can carry considerable current during an ESD event, once the device "snaps back" into bipolar operation.

In modern semiconductor fabrication technologies such as shallow trench isolation (STI) technologies, the junction breakdown voltage, which triggers the snapback device into operation, has increased. At the same time, the breakdown voltages of sensitive active circuit elements which are desirably protected, are getting lower. The relatively higher breakdown voltage of the protection circuit element reduces its effectiveness by making it too difficult for the protection circuit element to become activated and prevent damage to active circuit elements. Circuit elements of the active device may therefore be destroyed by the ESD event before the protection circuit element turns on.

Figure 1:
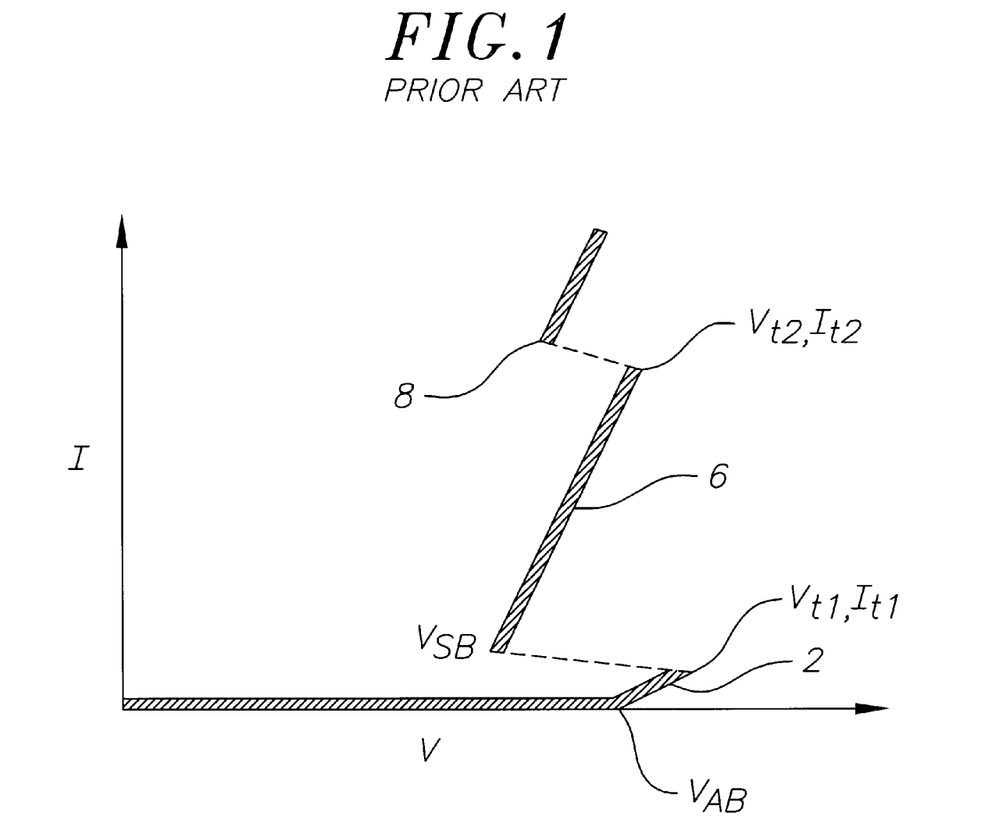
FIG. 1 is a current-voltage curve of a conventional snapback device as in the PRIOR ART.

The current (I)/voltage(V) characteristics of a conventional snapback device is shown in FIG. 1. During an ESD event, both the current I and voltage V of the snapback device are increased. As the voltage on the conventional snapback device is increased with respect to the substrate in which the snapback device is formed, avalanche breakdown occurs when avalanche breakdown voltage $V_{AB}$ is exceeded. The avalanche breakdown region is shown as segment 2 of the I–V curve shown in FIG. 1. When the avalanche current becomes sufficiently high, the device goes into bipolar snapback and the voltage across the device drops. The trigger point for bipolar snapback is characterized by the trigger voltage and trigger current, $V_{t1}$ and $I_{t1}$, respectively. The lowest voltage at which the bipolar action can be sustained is called the "snapback voltage," $V_{SB}$. When in bipolar snapback mode as indicated by segment 6 of the I–V curve shown in FIG. 1, considerable current can be carried throughout the snapback device at a lowered voltage and without damage occurring to the active circuit elements of the integrated circuit. When in bipolar snapback mode 6, the snapback device essentially functions as an n-p-n bipolar transistor and carries additional current, such as may be generated by an ESD event, and which otherwise would travel through and damage or destroy active device components of the integrated circuit device. In this manner, the snapback device suppresses device damage. When current is increased further, damage to the active circuit elements of the integrated circuit will eventually occur. The highest point before the active components of the integrated are damaged, is characterized by the coordinates of voltage $V_{t2}$ and current $I_{t2}$.

In order to be effective and to provide protection, the snapback device must logically be triggered into snapback, bipolar mode before the active circuit components of the integrated circuit device become damaged. Generally speaking, the breakdown voltage of the snapback device must be lower than the breakdown voltages of the active circuit components. The avalanche breakdown voltage, $V_{AB}$, is generally considered to be the breakdown voltage of the snapback device. The trigger voltage, $V_{t1}$, of the snapback device should desirably be lower than the breakdown voltages of the active current components to prevent active device damage from occurring before the trigger point is achieved. It is also desirable that voltage $V_{t1}$ not be much higher than the snapback voltage, $V_{SB}$. Stated alternatively, the voltage differential between $V_{t1}$ and $V_{SB}$ is desirably minimized. It is also desirable that the snapback device is capable of carrying as much current as possible to prevent damage to active circuit components.

Figure 2:
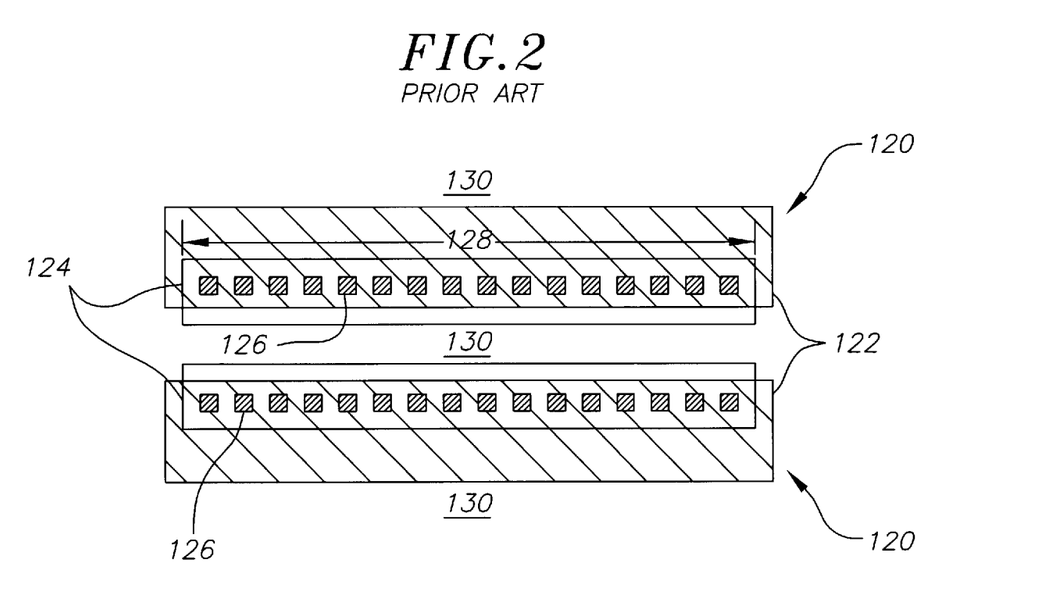
FIG. 2 is a plan view of a conventional snapback device as in the PRIOR ART.

The device layout of a conventional snapback device is shown in FIG. 2. FIG. 2 shows a snapback device formed of two substantially similar structures 120. Each structure 120 includes an active area 124 which is preferably an N+ impurity region formed in a substrate and surrounded by a P-doped impurity region 130 also formed within the substrate. Each structure 120 includes a conductive film 122 formed over active area 124 and electrically coupled to active area 124 through contacts 126. The snapback device includes a width 128. One conductive layer 122 is electrically coupled to an input/output pad and the other conductive layer 122 is electrically coupled to a voltage source or ground source.

One conventional method for increasing the effectiveness of a snapback device is to increase width 128 to provide more protection. Since this increased width comes at the expense of real estate on an integrated circuit chip which otherwise could be used for active circuit components, this approach is generally not favored. A more favored approach is to provide several smaller snapback devices in parallel to provide increased protection against ESD damage. Referring back to FIG. 1, for parallel snapback devices to be effective, it is necessary that $V_{t2}$ is greater than $V_{t}$. This is to ensure that each of the snapback devices turns on and snaps back to bipolar mode, before voltage $V_{t2}$ is achieved in any one snapback device, thereby damaging and/or destroying the active component elements of the integrated circuit device. This is not achieved in the conventional snapback device described by the I/V curve of FIG. 1.

It is therefore desirable to provide a protection circuit element that includes a breakdown voltage that is lower than the breakdown voltages of the active circuit elements of the integrated circuit device in which the protection circuit element is incorporated. It is also desirable to provide such a protection circuit element which is capable of carrying considerable current and includes a trigger point that does not significantly exceed the snapback voltage, and a trigger voltage which is lower than the voltage at which damage occurs to the active devices which the protection circuit element is designed to protect. It is further desirable to provide such a protection circuit element which provides significant protection versus ESD damage, while minimizing the amount of substrate space occupied by the protection circuit element.

SUMMARY OF THE INVENTION

The present invention provides a snapback device including two active areas of one polarity formed within a substrate surface and separated by a substrate region of the opposite polarity. The snapback device is included within a semiconductor device. Each active area is partially overlapped by an overlap film which is separated from the active area by a dielectric film. The overlap film may be formed of a metal or a semiconductor material. Each overlap film and associated active area are electrically coupled to a conductive layer formed over the structure. One conductive layer is advantageously coupled to input/output terminals of the semiconductor device and the other is coupled to a ground source and/or power supply. The snapback device includes a reduced avalanche breakdown voltage and trigger point voltage which allows the device to snap back into bipolar mode such that it is capable of carrying additional current at a relatively low voltage. The snapback device thereby protects active circuit components from being subjected to the considerable current produced by ESD events and which would otherwise damage and/or destroy the integrated circuit device.

BRIEF DESCRIPTION OF THE DRAWING

The present invention is best understood from the following detailed description, when read in conjunction with the accompanying drawing. It is emphasized that, according to common practice, the various features of the drawing are not to scale. On the contrary, the dimensions of the various features are arbitrarily expanded or reduced for clarity. Like numbers denote like elements throughout the figures and specification. Included in the drawing are the following figures.

DETAILED DESCRIPTION OF THE INVENTION

The present invention provides a protection circuit element—hereinafter referred to as a snapback device. The snapback device is formed within an integrated circuit or other semiconductor device, such devices hereinafter referred to collectively as integrated circuits. The snapback device is preferably coupled to an input/output terminal of the integrated circuit so that external current surges such as produced by events such as ESD will preferably be alleviated by the snapback device instead of damaging the active or functional circuit elements of the integrated circuit. According to an exemplary embodiment, two or more snapback devices may be connected in parallel. According to one exemplary embodiment, the snapback device or devices may be included in the I/O buffer section of an integrated circuit. According to another exemplary embodiment, the snapback device of the present invention may be included on a test chip. The snapback device or devices may be included in any of various integrated circuit or other semiconductor devices formed using various technologies.

Figure 3:
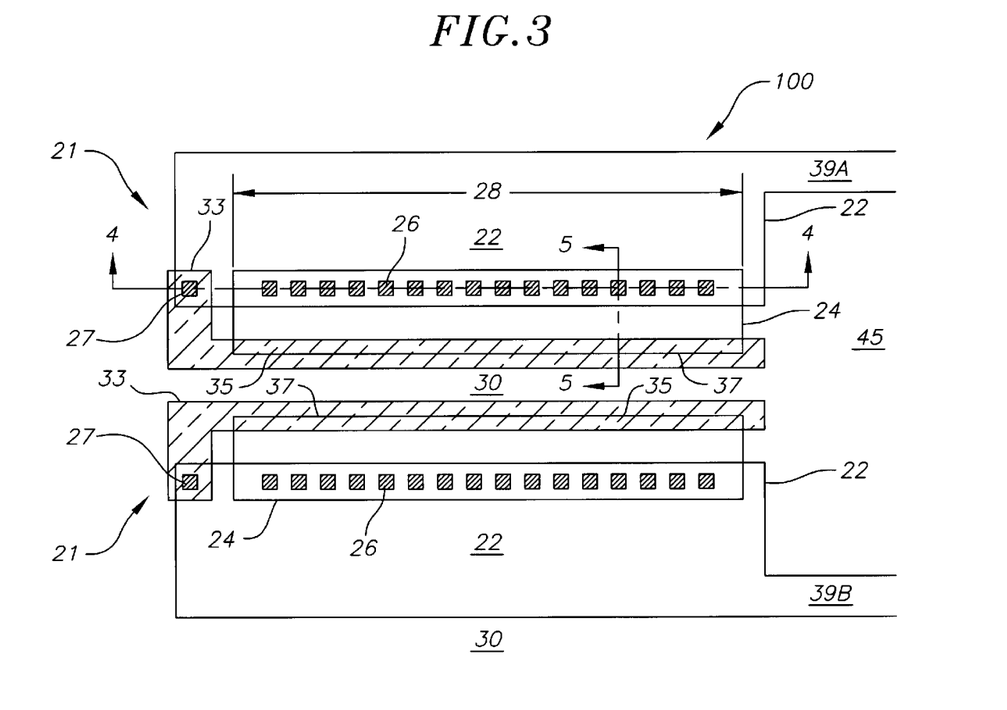
FIG. 3 is a plan view of an exemplary snapback device according to the present invention.

FIG. 3 is a plan view of an exemplary snapback device 100 of the present invention. FIG. 3 includes a pair of substantially similar components 21 which combine to produce snapback device 100. Each component 21 includes an active area 24 formed in a substrate region. According to an exemplary embodiment, active area 24 may be an n-type impurity region formed within substrate region 30, which may be a p-type impurity region. Each active area 24 may be an $n^+$ impurity region and may include an n-type dopant impurity concentration with the range of $10e^{19}$–$10e^{21}$ dopant atoms/cm$^3$, but other dopant concentrations may be used alternatively. According to one exemplary embodiment, substrate region 30 may be a conventionally formed P-well or P-tub region formed within a silicon substrate or within an epitaxial silicon layer of an SOI (silicon-on-insulator) substrate. Active areas 24 are formed within substrate region 30 and surrounded laterally and from below by substrate region 30 in an exemplary embodiment. According to an exemplary embodiment, each may be formed within surface 45 of a silicon substrate. According to another exemplary embodiment, substrate region 30 may only be formed between active areas 24. Generally speaking, active areas 24, each of the same polarity, are separated by substrate region 30 of the opposite polarity. Two n-p junctions are therefore formed between the active areas 24. Active areas 24 and substrate region 30 may be formed using conventional patterning and impurity introduction methods. Substrate region 30 may include an overall dopant impurity concentration ranging from $10e^{15}$ to $10e^8$, but other concentrations may be used alternatively. Conventional and suitable dopant impurity species may be used. Substrate region 30 preferably includes a discrete region of increased dopant concentration referred to as a tie region. With appropriate contacts and conductive interconnects, the tie region may be used to control the voltage of substrate region 30. The tie region may have a concentration within the range of $10e^{19}$–$10e^{21}$ dopant atoms/cm$^3$. Each active area 24 may have a dopant concentration that is greater than the overall dopant concentration of substrate region 30 in an exemplary embodiment. As will be shown in the cross-sectional views shown in FIGS. 4 and 5, active areas 24 are preferably formed within substrate surface 45 and are bounded by a field oxide film formed on or within the substrate and which terminates at the boundaries of active areas 24. According to the exemplary embodiment in which an n-type active area 24 is formed within a p-type substrate region 30, an n-p-n structure is formed. Snapback device 100 includes width 28.

Each film segment 33 bounds at least one of the peripheral edges 37 of respective active area 24. Each film segment 33 extends along the interface formed between active area 24 and substrate region 30, and may be formed of conventional semiconductor or conductive materials and patterned using conventional methods. In an exemplary embodiment, film segments 33 may each be formed of polysilicon. The polysilicon may be n-doped, p-doped, or undoped. According to another exemplary embodiment, film segment 33 may be a "polycide" film comprised of a polysilicon film and a silicide film formed thereover. Any of various silicide films may be used according to the various exemplary embodiments. According to yet another exemplary embodiment, film segments 33 may be formed of metals. Respective film segments 33 may be formed of the same or different materials. Although film segments 33 may be formed of various materials including conductive, metal materials, film segments 33 will be referred to collectively as semiconductor film segments 33 hereinafter. Each semiconductor film segment 33 includes overlap portion 35, which overlaps a portion of corresponding active area 24. Active areas 24 may take on any of various two-dimensional shapes within the substrate surface, according to the various exemplary embodiments and may extend to various depths. Active areas 24 are not intended to be limited to the generally rectangular shapes shown in exemplary FIG. 3. As such, peripheral edges 37 of active area 24 may take on various shapes. Overlap portion 35 is therefore intended to be exemplary only, and according to other exemplary embodiments, may extend along two or more sides of peripheral edge 37. Overlap portion 35 may extend only partially along a side of peripheral edge 37, or it may extend along a non-linear portion of peripheral edge 37. Overlap portion 35 may include semiconductor film segment 33 overhanging active area 24 by a distance ranging from 0.05 to 1.0 microns in an exemplary embodiment, but other overlap distances may be used according to other exemplary embodiments. Overlap portion 35 of semiconductor film segment 33 is insulated from active area 24 by means of a dielectric film interposed therebetween. According to another exemplary embodiment, other insulating materials may be used to insulate semiconductor film segment 33 from active area 24. In one exemplary embodiment, the dielectric film/semiconductor film arrangement may be the same composite structure formed throughout the active circuitry of the integrated circuit and used as a gate structure in an active transistor, for example.

Conductive films 22 are formed over an insulating material such as a suitable inter-level dielectric film formed over each of the active area 24/semiconductor film segment 33 arrangements. Any of various suitable and conventional inter-level dielectric materials may be used. Conductive films 22 may be formed of aluminum, aluminum alloys, copper, or copper alloys, but various other conventional conductive materials may be used according to other exemplary embodiments. Conductive films 22 are formed at least partially over portions of corresponding active areas 24 and semiconductor film segments 33. Each conductive film 22 is generally isolated from direct contact with semiconductor film segment 33 and active area 24 by the inter-level dielectric film, but is electrically coupled to each by means of contacts formed through the inter-level dielectric film formed beneath the conductive film 22. An exemplary inter-level dielectric film will be shown in FIGS. 4 and 5. Each conductive film 22 may be electrically coupled to the corresponding active area 24 by means of contacts 26. In the exemplary embodiment shown, contacts 26 are arranged in a linear array, but they may be arranged in other configurations according to other exemplary embodiments. Various suitable contact sizes and pitches may be used according to various exemplary embodiments. According to one exemplary embodiment, contact sizes and pitches ranging from 0.1 to 1 micron may be used, but other contact sizes and pitches may be used in other exemplary embodiments. Each conductive film 22 is also electrically coupled to the corresponding semiconductor film segment 33 by means of corresponding contact 27. According to other exemplary embodiments, additional contacts 27 may be used to couple conductive film 22 to semiconductor film segment 33. Each component 21 includes active area 24, conductive film 22, and semiconductor film segment 33 being electrically coupled to the same electrical node, although overlap portion 35 of semiconductor film segment 33 is electrically insulated from direct contact to active area 24 in each case. The relative configuration and position of conductive film 22, semiconductor film segment 33 and active area 24 is exemplary only and other arrangements may be used alternatively.

Snapback device 100 is preferably connected across an input/output (I/O) terminal and a power supply or ground source of the integrated circuit. According to an exemplary embodiment, lead 39A of one component 21 may be directly coupled to an input/output (I/O) terminal, and lead 39B may be coupled to a $V_{ss}$ or $V_{DD}$ ground/power supply. In this manner, being directly coupled to the stressed I/O terminal at which the effects of an ESD device may be experienced, snapback device 100 may suppress the effects of such an event before such effects damage or destroy active circuit elements. Other electrical connection arrangements may be used to couple the snapback device to opposed electric nodes according to other exemplary embodiments. In an exemplary embodiment, snapback device 100 will be included in the buffer section of the integrated circuit device in which it is included.

Width 28 may vary depending on the substrate surface area available, the specific device application, the level of protection desired, and whether or not a plurality of snapback devices 100 are connected in parallel. Generally speaking, as width 28 increases, the amount of protection versus ESD events and other current surge phenomena, increases accordingly. According to various exemplary embodiments, width 28 may be 70, 100, or 130 microns, but various other widths within and outside of the range of 70–130 microns may be used according to other exemplary embodiments. According to an exemplary embodiment, a set of two snapback devices may be connected in parallel such that their respective leads 39A are coupled to a common I/O terminal. The present invention provides a snapback device characterized by a voltage/current curve in which $V_{t2}$ is greater than $V_{t1}$. This will be shown in FIG. 6. $V_{t2}$ is the voltage above which damage occurs to the active or functional components of the integrated circuit device in which the snapback device is incorporated. $V_{t1}$ is the voltage at which the snapback device triggers into bipolar snapback mode, essentially functions as a bipolar transistor, and is therefore capable of carrying additional current. This characteristic is advantageous because with $V_{t2}>V_{t1}$, the additional snapback device or devices, connected in parallel, will preferably all trigger into snapback operation before any device damage occurs due to the first snapback device achieving a current greater than $I_{t2}$.

Figure 4:
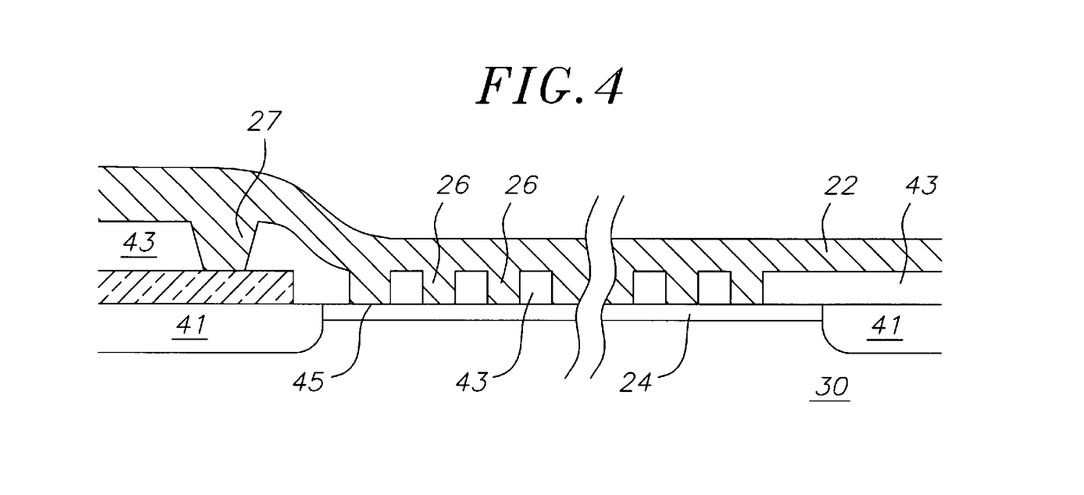
FIG. 4 is a cross-sectional view of an exemplary snapback device and taken along line 4—4 of FIG. 3.

FIG. 4 is a cross-sectional view taken along line 4—4 of FIG. 3. FIG. 4 shows field oxide film 41 formed within the substrate such as within substrate region 30 and bounding active area 24. In an exemplary embodiment, field oxide film 41 encroaches the original substrate surface. Active area 24 and substrate region 30 are each formed in substrate surface 45. Inter-level dielectric 43 is formed over semiconductor film segment 33 and active area 24. Inter-level dielectric 43 may be any of various suitable inter-level dielectric films available in the art. Contacts 26 are openings that extend through inter-level dielectric 43 and are filled with conductive material to provide electrical contact between conductive film 22 and active area 24. Contact 27 is formed through inter-level dielectric film 43 to provide contact between conductive film 22 and semiconductor film segment 33. In the illustrated exemplary embodiment, conductive film 22 is formed over inter-level dielectric 43 and within contacts 26 and 27 which extend through inter-level dielectric 43. According to other exemplary embodiments, a further conductive material may be formed within contact openings 26 and/or contact opening 27, and the interconnect conductive film 22 formed over inter-level dielectric 43 may contact the further conductive material. Semiconductor film segment 33 may include a thickness ranging from 300 angstroms to 10000 angstroms according to various exemplary embodiments. According to an exemplary embodiment, the substrate in which doped substrate region 30 and active area 24 are formed, may be single crystal silicon.

Figure 5:
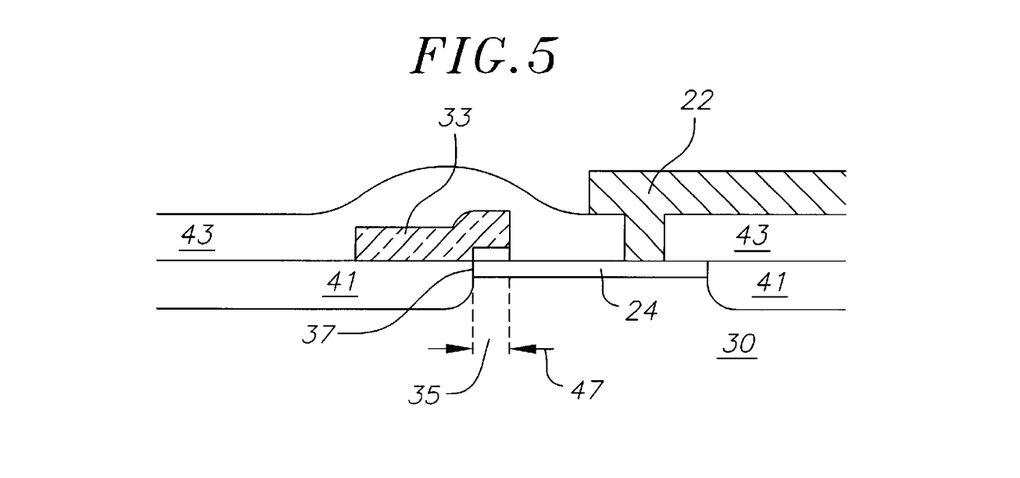
FIG. 5 is a cross-sectional view of an exemplary snapback device and taken along line 5—5 of FIG. 3.

FIG. 5 is a cross-sectional view taken along line 5—5 of the plan view shown in FIG. 3. FIG. 5 includes semiconductor film segment 33 overlapping active area 24 in overhang or overlap region 35 and extending over the substrate region 30/active area 24 interface formed along peripheral edge 37. Overlap region 35 includes a distance 47 which may range from 0.05 to 1 micron according to various exemplary embodiments, but different overhang distances may be used alternatively. Dielectric film 48 separates semiconductor film segment 33 from active area 24. In an exemplary embodiment, the dielectric film 48 may be a gate dielectric film and the semiconductor film segment 33/dielectric film 48 structure may form transistor gates in other regions of the integrated circuit device.

Figure 6:
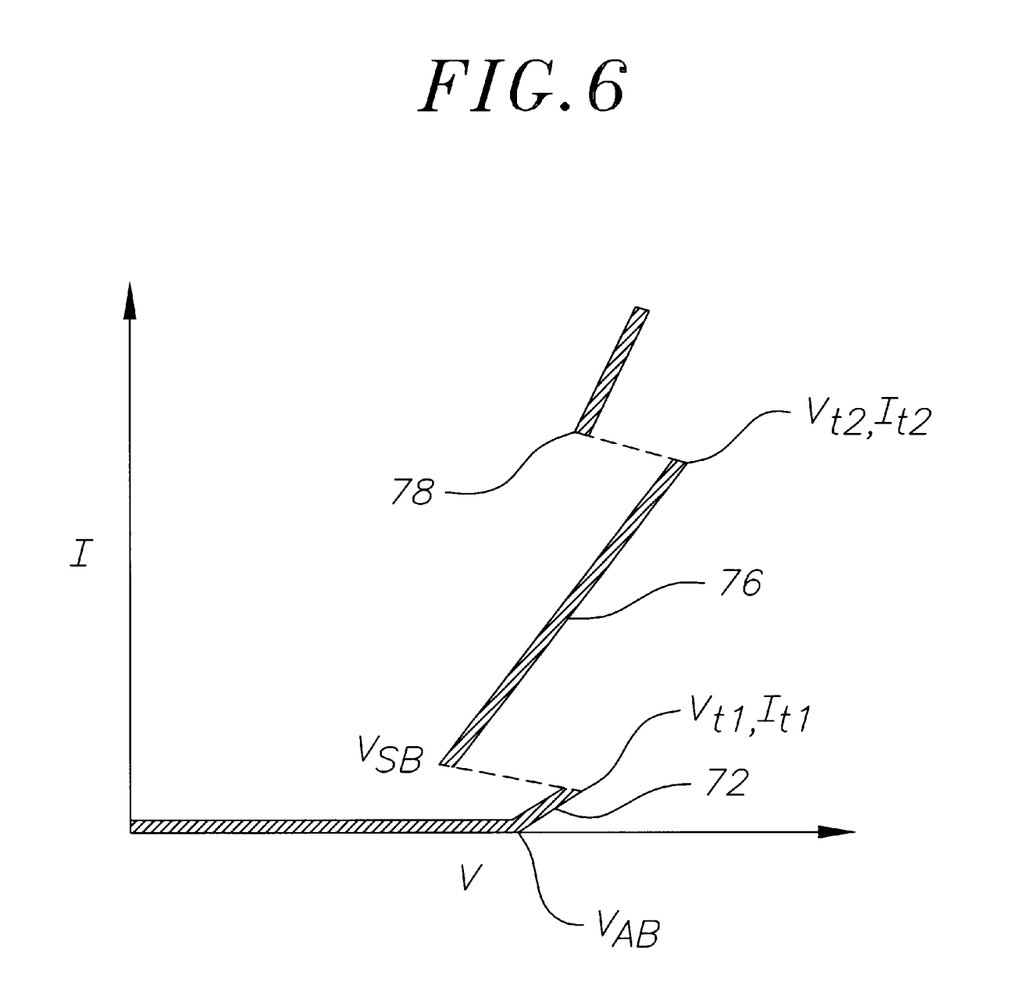
FIG. 6 is a current/voltage curve of an exemplary snapback device according to the present invention.

An exemplary I/V curve of an exemplary n$^+$-p-n$^+$ snapback device according to the present invention, is shown in FIG. 6. The voltage across the device represents the potential difference between the stressed terminal—lead 39A coupled to the input/output of the device, and the grounded terminal—lead 39B coupled to the ground/power supply. As the voltage on the snapback device is increased past the avalanche breakdown voltage $V_{AB}$, the stressed n$^+$-p junction breaks down, avalanche breakdown occurs and current begins to preferably flow from the stressed active area to the highly doped tie region within substrate region 30. The avalanche breakdown voltage $V_{AB}$, is generally considered to be the breakdown voltage of the snapback device. Current flow increases further and causes a corresponding increase in voltage within the avalanche breakdown region represented by segment 72. Once the trigger point, characterized by voltage $V_{t1}$ and current $I_{t1}$, is achieved, the snapback device snaps back into bipolar mode as the grounded, non-stressed p-n diode becomes forward biased or "turned on", and the device is capable of carrying additional current at a reduced voltage such as snapback voltage $V_{SB}$. The snapback device is in bipolar snapback mode as indicated by segment 76. During the period of increased current flow represented by segment 76, the snapback device essentially functions as an n-p-n bipolar transistor and current flows from n$^+$ to p to n$^+$. The lowest voltage at which bipolar action can be sustained is called the snapback voltage, $V_{SB}$. An advantage of the bounded snapback device of the present invention is its ability to carry additional current, indicated by segment 76, before damage occurs to the active devices. Device damage occurs after the damage point, characterized by coordinates $V_{t2}$ and $I_{t2}$, is achieved, and device damage occurs within the region represented by segment 78 of the curve. Another advantage is a decrease in breakdown voltage.

The improved semiconductor film-bounded snapback device of the present invention includes an avalanche breakdown voltage, $V_{AB}$, and a trigger point voltage, $V_{t1}$, which are each preferably lower than the breakdown voltages of the active electrical components of the functional device, and the snapback device is capable of carrying an increased current when in bipolar mode. In this manner, snapback occurs, and additional current can be carried through the snapback device at a relatively low voltage, before the functional or active components of the integrated circuit are damaged due to an ESD event, for example. FIG. 6 also shows that the damage point voltage, $V_{t2}$, is greater than the trigger point voltage, $V_{t1}$. This assures that when multiple snapback devices are connected in parallel and a first of the snapback devices is triggered into snapback mode, the other snapback devices will advantageously reach their trigger points and snap back into bipolar transistor mode, before device damage occurs due to voltage $V_{t2}$ being exceeded on the first snapback device.

The snapback device of the present invention may be included in any of various integrated circuit devices formed using any of various processing technologies. The snapback device may be formed using any suitable processing technology. The snapback device of the present invention finds particular application in 0.2 micron CMOS (complementary metal oxide semiconductor) device designs formed using STI (shallow trench isolation) technologies, for example. The snapback device may be formed in devices formed on bulk semiconductor substrates, or on 3.2 micron or 5.0 micron epitaxial substrates. In an exemplary embodiment, the snapback devices may be included within 5 volt-tolerant buffer sections. The snapback devices of the present invention may be coupled to I/O terminals and other semiconductor devices through various bus lines and other connection architecture.

The preceding merely illustrates the principles of the invention. It will thus be appreciated that those skilled in the art will be able to devise various arrangements which, although not explicitly described or shown herein, embody the principles of the invention and are included within its scope and spirit. Furthermore, all examples and conditional language recited herein are principally intended expressly to be only for pedagogical purposes and to aid in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and the functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein. Rather, the scope and spirit of the present invention is embodied by the appended claims.

What is claimed is:

1. A semiconductor protection structure formed within a semiconductor device and comprising:

a duality of active areas formed within a substrate surface and each including dopant impurities of a first polarity therein, said duality of active areas spaced apart and including a substrate region including dopant impurities of an opposite polarity therebetween, each active area bounded by an edge forming an interface between said active area and said substrate region;

a first overlap film overlapping a first active area of said duality of active areas, and a second overlap film overlapping the second active area, each respective overlap film separated from said corresponding active area by a dielectric film interposed therebetween, and formed of one of a conductive material and a semiconductor material;

a first conductive film electrically coupled to said first active area through a first plurality of contact openings, said first overlap film through at least one first opening, and an input/output terminal of said semiconductor device, and a second conductive film electrically coupled to said second active area through a second plurality of contact openings, said second overlap film through at least one second opening, and at least one of a power supply and a ground source.

2. The semiconductor protection structure as in claim 1, in which each of said duality of active areas is formed within said substrate region, and laterally and subjacently surrounded by said substrate region.

3. The semiconductor protection structure as in claim 1, wherein each of said pluralities of contact openings and said openings, extends through an insulating layer disposed beneath said first conductive film and said second conductive film.

4. The semiconductor protection structure as in claim 1, in which each overlap film further extends over portions of said substrate region and is electrically insulated from said portions of said substrate region.

5. The semiconductor protection structure as in claim 1, in which said first overlap film overlaps said first active area by a distance within the range of 0.05 micron to 1 micron.

6. The semiconductor protection structure as in claim 1, in which said semiconductor protection structure is disposed within a buffer section of said semiconductor device.

7. The semiconductor protection structure as in claim 1, further comprising a further semiconductor protection structure as in claim 1, said semiconductor protection structure and said further semiconductor protection structure being electrically coupled in parallel.

8. The semiconductor protection structure as in claim 7, in which said semiconductor device comprises an integrated circuit including a plurality of active device elements therein and each of said semiconductor protection structure and said further semiconductor protection structure includes a breakdown voltage being lower than associated breakdown voltages of said active device elements.

9. The semiconductor protection structure as in claim 7, in which said semiconductor device comprises an integrated circuit including a plurality of active device elements therein and each of said semiconductor protection structure and said further semiconductor protection structure snaps into bipolar operation mode before said plurality of active device elements become damaged due to an electrostatic event.

10. The semiconductor protection structure as in claim 1, wherein said first overlap film extends along a first interface formed between a first edge of said first active area and said substrate region, and said second overlap film extends along a second interface formed between a second edge of said second active area and said substrate region.

11. The semiconductor protection structure as in claim 1, wherein each said overlap film comprises a polysilicon film, and said substrate is formed of silicon.

12. The semiconductor protection structure as in claim 1, in which each of said pluralities of contact openings comprises a linear array.

13. The semiconductor protection structure as in claim 1, in which each of said active areas comprises an n-type dopant impurity region and said substrate region comprises a p-type dopant impurity region.

14. The semiconductor protection structure as in claim 13, in which each active area includes a dopant impurity concentration being greater than an average dopant impurity concentration of said substrate region.

15. The semiconductor protection structure as in claim 13, in which said semiconductor device includes a plurality of active circuit elements therein and further comprising a p-n junction which breaks down at a voltage being lower than associated breakdown voltages of said active circuit elements.

16. The semiconductor protection structure as in claim 1, in which said substrate region includes a discrete portion thereof which includes a dopant impurity concentration being greater than a dopant impurity concentration in other portions of said substrate region.

17. The semiconductor protection structure as in claim 1, wherein said semiconductor device comprises an integrated circuit.

18. The semiconductor protection structure as in claim 17, in which said integrated circuit includes a plurality of active circuit elements therein and said semiconductor protection structure includes a breakdown voltage being lower than associated breakdown voltages of said plurality of active circuit elements.

19. The semiconductor protection structure as in claim 17, in which said integrated circuit includes a plurality of active circuit elements therein and said semiconductor protection structure includes a trigger point including a trigger voltage being lower than associated breakdown voltages of said plurality of active circuit elements, and when said trigger point is achieved, said semiconductor structure functions essentially as an n-p-n bipolar transistor capable of carrying current without damaging said active circuit elements.

20. A semiconductor protection circuit comprising an n-p-n bipolar transistor included within a buffer section of a semiconductor device, said n-p-n bipolar transistor including each of its n-doped regions having a polysilicon film at least partially overlapping said n-doped region and separated therefrom by a dielectric film, each respective polysilicon film electrically coupled to a respective conductive film being further coupled to said respective n-doped region.

21. The semiconductor protection circuit as in claim 20, in which one of said n-doped regions is electrically coupled to one of an input/output terminal of said semiconductor device and ground, and the other n-doped region is electrically coupled to the other of said input/output terminal and said ground.

* * * * *